United States Patent [19]

Toda

[11] Patent Number: 4,752,731
[45] Date of Patent: Jun. 21, 1988

[54] ELECTRONIC TYPE ELECTRIC ENERGY METER

[75] Inventor: Masayoshi Toda, Fukuyama, Japan

[73] Assignee: Mitsubishi Denki Kabushiki Kaisha, Japan

[21] Appl. No.: 873,983

[22] Filed: Jun. 13, 1986

[30] Foreign Application Priority Data

Jun. 14, 1985 [JP] Japan ................ 60-130183

[51] Int. Cl.$^4$ .......................... G01R 21/133
[52] U.S. Cl. .................... 324/142; 364/483; 364/606
[58] Field of Search ............ 324/142; 328/160; 364/483, 606, 753, 754, 841, 843

[56] References Cited

U.S. PATENT DOCUMENTS 3,780,273 12/1973 Turrell ................ 364/843 X

FOREIGN PATENT DOCUMENTS

| 2427525 | 12/1975 | Fed. Rep. of Germany |         |
|---------|---------|----------------------|---------|
| 2444981 | 4/1976  | Fed. Rep. of Germany |         |
| 2651579 | 5/1978  | Fed. Rep. of Germany |         |
| 75945   | 6/1977  | Japan                | 364/753 |
| 124845  | 9/1980  | Japan                | 364/754 |
| 974289  | 11/1982 | U.S.S.R.             | 324/142 |

OTHER PUBLICATIONS

Johnson, "A Digital Quarter Square Multiplier", IEEE Trans. on Computers, vol. C-29, No. 3, Mar. 1980, pp. 258-261.
Stockton, J., "Proposed Quarter Squares Double Dual-Slope Digital Wattmeter", Electronics Letters, vol. 16, No. 21, Oct. 9, 1980, pp. 819-820.
"A Wideband Sampling Wattmeter", Gerald N. Stenbakken, *IEEE Transaction on Power Apparatus and Systems*, vol. PAS-103, No. 10, Oct. 1984.
"Halbleiter-Schaltungstechnik", Tietze et al, Springer-Verlag, 1984.

Primary Examiner—Reinhard J. Eisenzopf
Assistant Examiner—Stephen M. Baker
Attorney, Agent, or Firm—Leydig, Voit & Mayer

[57] ABSTRACT

An electronic type electric energy meter comprising an analog adder and an analog subtracter by which signals proportional to a voltage and a current of a circuit to-be-measured are respectively added and subtracter therebetween, A/D converters which convert outputs of the analog adder and the analog subtracter into digital values, and an arithmetic control unit by which the digital values from the A/D converters corresponding to the analog addition value and subtraction value are respectively squared so as to obtain a difference of the squared values, and the difference is accumulated thereby to measure electric energy. The values of the input analog voltages of the A/D converters vary in only narrow ranges, so that the electric energy can be calculated at high precision in a wide current variation range by means of the A/D converters having small numbers of bits.

5 Claims, 1 Drawing Sheet

ELECTRONIC TYPE ELECTRIC ENERGY METER

BACKGROUND OF THE INVENTION

This invention relates to an electronic type electric energy meter based on a digital multiplication system.

FIG. 2 is a block diagram which schematically shows a prior-art electronic type electric energy meter described in the official gazette of Japanese Patent Application Publication No. 57-5466 by way of example.

Referring to the figure, numerals 1 and 2 designate input terminals to which the voltage and current of a circuit to-be-measured are respectively applied and which are respectively connected to the input terminals of A/D (analog-to-digital) converters 5 and 6. Numeral 7 designates a digital multiplier, the input terminals of which are connected to the output terminals of the A/D converters 5 and 6. On the other hand, the output terminal of the digital multiplier 7 is connected to the input terminal of an accumulator 8. The output terminal of the accumulator 8 is connected to the output terminal 9 of the electronic type electric energy meter 100.

Next, the operation of the electronic type electric energy meter 100 arranged as described above will be explained. A voltage and current proportional to the voltage and current of the circuit to-be-measured applied to the input terminals 1 and 2 are respectively supplied to the A/D converters 5 and 6. These A/D converters 5 and 6 A/D-convert the input voltage and current, and deliver digital values to the multiplier unit 7 respectively. The product of the digital values obtained by the multiplier unit 7 is a value which is proportional to the instantaneous power of the circuit to-be-measured, and which is accumulated by the accumulator 8. Thenceforth, such operations are repeated, and the accumulator 8 delivers a pulse output to the output terminal 9 each time the internal value thereof reaches a predetermined value.

With the prior-art electronic type electric energy meter 100, in order to satisfy the precision of an electronic type electric energy meter, an A/D converter of very high precision (for example, an A/D converter having many bits) is required of, for example, the A/D converter 6 on the current signal side. More specifically, the performance which is required of the electric energy meter is such that the precision is guaranteed for a voltage variation range of ±10% of a rated voltage value or so, but that the absolute precision is guaranteed for a current variation range of 1/60 to 1/1 of a rated current value. By way of example, when it is intended to guarantee the absolute precision of ±1% at the current value of 1/60 of the rating, a quantization error at this point needs to be less than 1/100, in other words, a resolution needs to be $1/128 = 1/2^7$ which corresponds to 7 bits.

In this regard, since the current input becomes 60 times greater at the rated value, a dynamic range of at least 64 times $= 2^6$ times (corresponding to 6 bits) is needed. In consequence, an A/D converter of 7 bits + 6 bits = 13 bits is needed as the A/D converter 6. For the electronic type electric energy meter, a low cost and a high reliability are necessary conditions in view of the uses thereof. It is therefore an indispensable condition that an expedient for fabricating the meter is capable of mass production, nemely, monolithic IC implementation. However, an A/D converter having a high resolution of 13 bits is very difficult to attain using a monolithic IC, and presents serious hindrances to the lowering of power consumption, the reduction of cost and the mass production thereof.

SUMMARY OF THE INVENTION

This invention has been made in order to eliminate the disadvantages as mentioned above, and has for its object to provide an electronic type electric energy meter whose precision is high in a wide load range, and which is low in cost and has high reliability by the use of A/D converters having a small numbers of bits (of low resolution).

According to the present invention, an electronic type electric energy meter is provided which comprises an analog adder and an analog subtractor by which signals proportional to a voltage and a current are respectively added and subtracted. The meter further comprises A/D converters and an arithmetic control unit. The A/D converters convert the outputs of the analog adder and the analog subtractor into digital values. The arithmetic control unit squares the digital values output by the A/D converters, obtains a difference of the squared values, and accumulates the difference to measure electric energy.

According to the present invention, an electronic type electric energy meter is also provided which comprises analog circuitry for providing first and second analog signals indicative of the sum and difference, respectively, of a voltage input and a current input. The meter further comprises an A/D converter coupled to the analog circuitry for converting the first and second analog signals to first and second digital signals. The meter further comprises circuitry coupled to the A/D converter for generating a third digital value indicative of the difference between the squares of the first and second digital values and circuitry for accumulating the third digital value to measure electric energy.

DESCRIPTION OF THE PREFERRED EMBODIMENT

Figure 1:
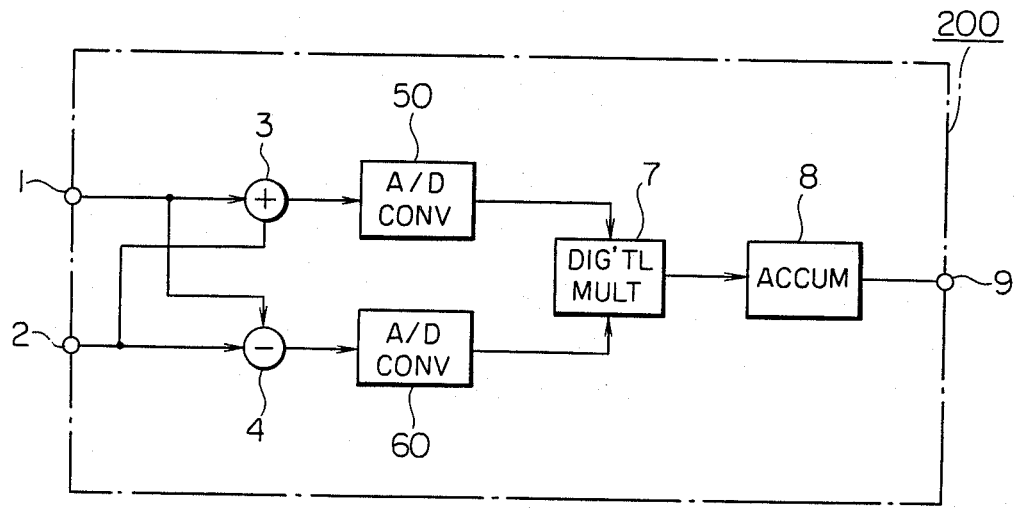
FIG. 1 is a block diagram showing an electronic type electric energy meter according to an embodiment of this invention.
Figure 2:
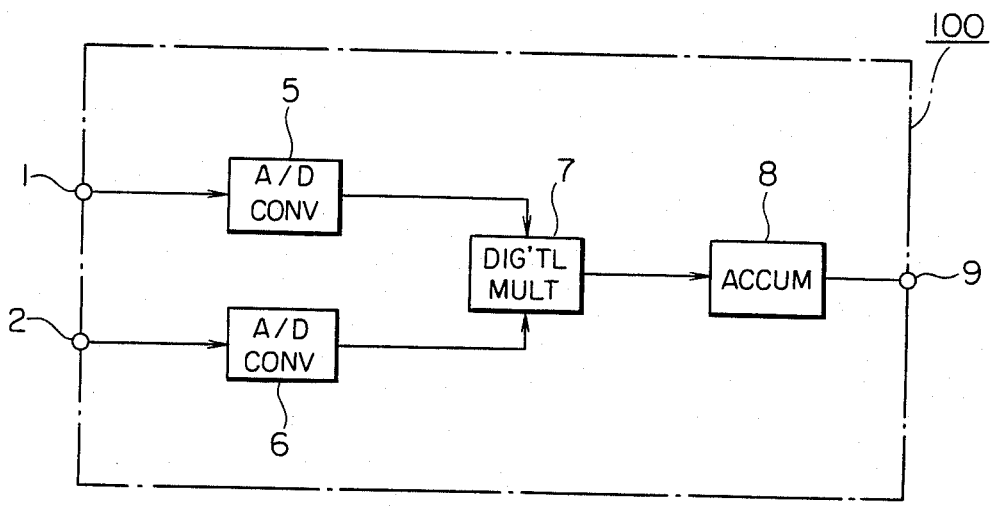
FIG. 2 is a block diagram showing an electronic type electric energy meter in a prior art.

FIG. 1 is a block diagram showing one embodiment of an electronic type electric energy meter according to this invention. In the figure, the same portions as in FIG. 2 are assigned identical symbols, and they shall not be repeatedly explained.

Referring to FIG. 1, numeral 3 designates an analog adder, one of the input terminals of which is connected to a voltage input terminal 1, the other being connected to a current input terminal 2, and the output terminal of which is connected to an A/D converter 50. Numeral 4 designates an analog subtracter, one of the input terminals of which is connected to the voltage input terminal 1, the other being connected to the current input terminal 2, and the output terminal of which is connected to an A/D converter 60.

Next, the operation of the electronic type electric energy meter 200 of the above arrangement will be described.

A voltage and current respectively applied to the input terminals 1 and 2 are applied to the inputs of both the analog adder 3 and the analog subracter 4.

The analog adder 3 adds the input voltage and current, and delivers the resulting analog voltage to the A/D converter 50.

The analog subtracter 4 performs the subtraction between the input voltage and current, and delivers the resulting analog voltage to the A/D converter 60.

The A/D converters 50 and 60 convert the respective input analog voltages into digital values, respectively.

Assuming now that the arrangement of each of the A/D converters 50 and 60 be of binary 10 bits, quantization errors which develop at this time become $\Delta V = 10/_210$ [V] when the full scale inputs of the A/D converters 50 and 60 are 10 [V].

There will be explained below a case where the current to be applied to the input terminal 2 varies in a range of 1/60–1/1 of a rated value, and where parts proportional to the current components of the voltage values to be applied to the A/D converters 50 and 60 are 3 [V] at the rating.

With an arrangement wherein the variation range of the parts proportional to the current components extends from 0.05 [V] at 1/60 of the rated value to 3 [V] at 1/1 thereof and wherein parts proportional to the voltage components of the voltage values to be applied to the A/D converters 50 and 60 at the rated value of the voltage to be applied to the input terminal 1 become 5 [V], the input voltage values of the A/D converters 50 and 60 become as listed in Table 1.

TABLE 1

| Input Voltage of Input Terminal 1 | Input Current of Input Terminal 2 | Input Voltage of A/D Converter 50 | Input Voltage of A/D Converter 60 |
|---|---|---|---|
| Rated Value | 1/1 of Rated Value | 5[V] + 3[V] = 8[V] | 5[V] − 3[V] = 2[V] |
| Rated Value | 1/60 of Rated Value | 5[V] + 0.05[V] = | 5[V] − 0.05[V] = 4.95[V] |

First, when the current value to enter the input terminal 2 is 1/1 of the rated value, a quantization error to develop in the A/D converter 50, in terms of % based on the input voltage thereof becomes $$\frac{\Delta[V]}{8[V]} \times 100[\%] = \frac{10}{2^{10}[V]} \times \frac{1}{8[V]} \times 100[\%] = 0.122[\%].$$

Likewise, a quantization error to develop in the A/D converter 60 becomes $$\frac{10}{2^{10}[V]} \times \frac{1}{3[V]} \times 100[\%] = 0.326[\%].$$

Through the digital square operations of the quantization errors, an error corresponding to the digital value derived from the A/D converter 50 becomes $0.122 \times 2 = 0.244$ [%], and an error corresponding to the A/D converter 60 becomes $0.326 \times 2 = 0.65[\%]$.

Since the difference of the squared values is operated, the errors are added depending upon the weights of the numerical values to be operated. Therefore, the overall error becomes:

$$0.244[\%] + \left(\frac{2[V]}{8[V]}\right)^2 \times 0.65[\%] = 0.285[\%]$$

Next, when the value of the current to enter the input terminal 2 is 1/60 of the rated value, a quantization error to develop in the A/D converter 50, in terms of % becomes $$\frac{10}{2^{10}[V]} \times \frac{1}{5.05[V]} \times 100[\%] = 0.193[\%].$$

In the A/D converter 60, a quantization error is expressed by $$\frac{10}{2^{10}[V]} \times \frac{1}{4.95[V]} \times 100[\%] = 0.197[\%].$$

These values are digitally squared, and the difference of the results is taken, so that the overall error similarly becomes:

$$0.193[\%] \times 2 + \left(\frac{4.95[V]}{5.05[V]}\right)^2 \times 0.197[\%] \times 2 = 0.765[\%]$$

The embodiment has referred to the example of arrangement in which the A/D converters 50 and 60 are juxtaposed. However, the same object can be achieved even when the analog adder and subtracter 3, 4 are succeeded by analog switches, the two analog signals of which are processed by a single A/D converter.

Moreover, although the embodiment in which the analog adder 3 and the analog subtracter 4 are juxtaposed as being independent has been illustrated, an identical analog adder may well be used by changing the signs of the input voltage and current thereof.

As described above, with the prior art, an A/D converter of 13 bits has been necessary for compensating an error of 1.0% in a range of 1/60–1/1 by way of example, whereas according to this invention, after analog addition and subtraction, A/D conversion is performed and is followed by digital processing, whereby an equivalent performance can be attained with an A/D converter of 10 bits, and simply, the A/D converter of a resolution of ⅛ suffices. Therefore, in electronic type electric energy meters premised on mass production based on monolithic IC implementation, the provision of an article of low power consumption and high reliability at low cost becomes possible, so that the invention produces a very great effect.

What is claimed is:

1. An electronic type electric energy meter comprising an analog adder and an analog subtracter by which signals proportional to a voltage and a current of a circuit to-be-measured are respectively added and subtracted therebetween, A/D converters which convert outputs of said analog adder and said analog subtracter into digital values, and an arithmetic control unit by which the digital values from said A/D converters corresponding to the analog addition value and subtraction value are respectively squared so as to obtain a difference of the squared values, and by which the difference is accumulated to thereby measure electric energy.

2. An electronic type electric energy meter comprising:
analog means for providing first and second analog signals indicative of the sum and difference, respectively, of a voltage input and a current input;
A/D converter means coupled to the analog means for converting the first and second analog signals to first and second digital signals;

means coupled to the A/D converter means for generating a third digital value indicative of the difference between the squares of the first and second digital values; and means for accumulating the third digital value to measure electric energy.

3. The electronic type electric energy of claim 2 wherein the analog means includes an analog adder and an analog subtracter.

4. The electronic type electric energy meter of claim 2 wherein the A/D converter means includes first and second A/D converters.

5. The electronic type electric energy meter of claim 3 wherein the A/D converter means includes first and second A/D converters respectively coupled to the analog adder and the analog subtracter.

* * * * *